(12) United States Patent
Arimoto et al.

(10) Patent No.: US 7,970,041 B2
(45) Date of Patent: Jun. 28, 2011

(54) SEMICONDUCTOR LASER APPARATUS

(75) Inventors: Hideo Arimoto, Kodaira (JP); Masahiro Aoki, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 76 days.

(21) Appl. No.: 12/385,735

(22) Filed: Apr. 17, 2009

(65) Prior Publication Data

US 2009/0268772 A1  Oct. 29, 2009

(30) Foreign Application Priority Data

Apr. 24, 2008 (JP) ................................ 2008-114074

(51) Int. Cl.
*H01S 3/08* (2006.01)
(52) U.S. Cl. .............. 372/101; 372/99; 372/98; 372/92; 372/50.23; 372/50.12
(58) Field of Classification Search .................. 372/101, 372/99, 98, 92, 50.23, 50.12
See application file for complete search history.

(56) References Cited

U.S. PATENT DOCUMENTS

| 5,912,997 | A  | * | 6/1999 | Bischel et al. | ................... 385/15 |
| 2003/0002809 | A1 | * | 1/2003 | Jian | ................... 385/73 |
| 2003/0020865 | A1 | * | 1/2003 | Hoke | ................... 349/198 |
| 2003/0128431 | A1 | * | 7/2003 | Mitamura et al. | ............ 359/577 |

OTHER PUBLICATIONS

Jan De Merlier et al., "Wavelength Channel Accuracy of an External Cavity Wavelength Tunable Laser with Intracavity Wavelength Reference Etalon", Journal of Lightwave Technology, vol. 24, No. 8, Aug. 2006, pp. 3202-3209.

* cited by examiner

*Primary Examiner* — Minsun Harvey
*Assistant Examiner* — Kinam Park
(74) *Attorney, Agent, or Firm* — Stites & Harbison PLLC; Juan Carlos A. Marquez, Esq.

(57) ABSTRACT

A wavelength variable laser smaller in size than the conventional one can be achieved by arranging a gain chip, an etalon filter and a fifth reflective mirror on an AlN submount and longitudinally integrating the gain chip in which a 45° mirror and a lens are integrated and the etalon filter. A laser cavity has a structure in which light passes through an active layer from a first reflective mirror realized by an end surface of the gain chip, is reflected by the 45° mirror at an angle of 90° and then passes through the lens. The light having passed through the lens is converted into parallel light, passes through the etalon filter and reaches the fifth reflective mirror and is then reflected. The reflected light returns through the same optical path and reaches the first reflective mirror realized by the end surface of the gain chip.

8 Claims, 9 Drawing Sheets

SEMICONDUCTOR LASER APPARATUS

CROSS-REFERENCE TO RELATED APPLICATION

The present application claims priority from Japanese Patent Application No. JP 2008-114074 filed on Apr. 24, 2008, the content of which is hereby incorporated by reference into this application.

TECHNICAL FIELD OF THE INVENTION

The present invention relates to a semiconductor laser apparatus, and more particularly to a technique effectively applied to a wavelength variable laser for use in communications and optical measurement.

BACKGROUND OF THE INVENTION

The transmission capacity of the optical communication has been rapidly increasing every year, and the wavelength division multiplex (WDM) has been put into practical use as a low-cost, high-speed and large-capacity transmission technology to meet such a requirement. The WDM is a technology for transmitting different signals at respective wavelengths by simultaneously using a number of monochromatic lights (several ten to hundred wavelengths) whose frequencies differ by only 50 GHz or 100 GHz, and since the transmission capacity per one fiber can be increased several tens of times or more, the fiber installation cost can be significantly reduced.

Conventionally, a wide variety of semiconductor lasers having different wavelengths and a modularized device (hereinafter, abbreviated as module) for driving them have been required for the light source of the WDM. When manufacturing lasers, crystal has to be made for each wavelength and also a module has to be manufactured for each wavelength, which poses a cost problem. For its solution, a wavelength variable module capable of freely varying a wavelength has been developed. Since this wavelength variable module can vary the light wavelength in a range of about 40 nm, what is needed is to manufacture light-emitting elements of several wavelengths and a module, and it is possible to provide a module at low cost, so that it has become a main light source of the WDM.

In the field of the optical measurement, in particular, in the field of the biological optical measurement, with the further diversification of the substances to be observed, a wavelength variable light source with a wide range of about 0.7 to 1.6 µm has been required. As specific applied fields, nonlinear optical imaging, optical tomography for visualizing the cancer and the immune system and the optoacoustic technique can be enumerated.

Various types of wavelength variable lasers have been examined up to now. In the communications use, an example of a wavelength variable laser of an external cavity type using a liquid crystal filter can be cited. FIG. 12 shows the configuration thereof (see JOURNAL OF LIGHTWAVE TECHNOLOGY, VOL. 24, NO. 8, Aug. 2006, P3202-3209 (Non-patent Document 1)). The wavelength variable laser shown in FIG. 12 is constituted of a liquid crystal filter 101, a glass etalon 102, a lens 103 and a gain chip 104. The gain chip 104 has a structure in which a gain multilayer 106 for generating an optical gain, a phase control multilayer 107, a rear surface electrode 108, a gain current electrode 109, a phase control current electrode 110 are formed on an InP (indium phosphide) substrate 105. The light emitted from the gain chip 104 is converted into parallel light by the lens 103 and is incident on the glass etalon 102 and the liquid crystal filter 101. The light is reflected by the liquid crystal filter 101 and is incident on the gain chip 104 through the same optical path, thereby constituting the laser cavity. Since the liquid crystal filter 101 and the glass etalon 102 have the wavelength selectivity and the reflection wavelength of the liquid crystal filter 101 can be controlled by voltage application, the wavelength variable laser is obtained. This wavelength variable laser can emit all the wavelength range of the so-called C band used in the optical communication.

Also, as the wavelength variable laser for use in the optical measurement, titanium sapphire laser, an optical parametric oscillator and others have been used.

SUMMARY OF THE INVENTION

In the communications use, the size reduction of the communication module has been strongly demanded, and the size reduction of the wavelength variable laser has been strongly desired. In the example shown in FIG. 12, the size reduction to shorten the cavity length to 10 mm or less is difficult considering the size of the lens 103 and the distance between the lens 103 and the gain chip 104. Also, in the wavelength variable laser using semiconductor, the wavelength is determined by the gain band of the gain chip 104, and it is difficult to realize the wavelength variability of more than 100 nm.

In the optical measurement use, the development to the three-dimensional imaging has been achieved in the linear optical imaging, the optical tomography, the optoacoustic technique and the optical topography. At this time, in order to obtain a three-dimensional image in a short period of time, a number of light sources are necessary. The titanium sapphire laser, the optical parametric oscillator and others used at present have a module-level size, and it is impossible to use a number of light sources at the same time.

An object of the present invention is to provide a technique capable of reducing the size of the wavelength variable laser.

Also, another object of the present invention is to provide a technique capable of realizing an ultrawideband wavelength variable laser by multiplexing lights emitted from a plurality of gain chips.

The above and other objects and novel characteristics of the present invention will be apparent from the description of this specification and the accompanying drawings.

The typical ones of the inventions disclosed in this application will be briefly described as follows.

A semiconductor laser apparatus according to the present invention comprises: a first semiconductor substrate; an optical waveguide layer including an active layer formed on a part of a first surface of the first semiconductor substrate; a first reflective mirror provided at one end of the optical waveguide layer; a second reflective mirror which is a 45° mirror provided at the other end of the optical waveguide layer on an opposite side of the one end and inclined by 45° with respect to an extending direction of the optical waveguide layer; a first convex lens provided on a second surface of the first semiconductor substrate on a back side of the first surface so as to be on an optical axis of the second reflective mirror; an etalon provided above the second surface and including a first substrate having a third reflective mirror and a second substrate having a fourth reflective mirror on the first substrate; and a fifth reflective mirror provided above the fourth reflective mirror of the etalon, wherein the fifth reflective mirror is provided orthogonally to an optical axis of light emitted from the first convex lens, and a laser cavity is constituted between the first reflective mirror and the fifth reflective mirror.

The effects obtained by typical one of the inventions disclosed in this application will be briefly described below.

Since the laser cavity can be configured to have a vertically bent shape, the cavity length can be shortened, and the semiconductor laser module can be reduced in size. Further, by combining a plurality of gain chips, the ultrawideband wavelength variable laser can be realized.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. In addition, when "formed from A" and "formed of A" are mentioned for the components and the like in the embodiments, it is needless to say that other components are not excluded except the case where it is particularly specified that A is the only element thereof.

Similarly, in the embodiments described below, when the shape of the components, positional relation thereof and the like are mentioned, the substantially approximate and similar shapes and the like are included therein unless otherwise stated or except the case where it can be conceived that they are apparently excluded in principle. The same goes for the numerical value and the range described above.

Still further, when the materials and the like are mentioned, the specified material is a main material unless otherwise stated or except the case where it is not so in principle or in situation, and the secondary elements, additives, additional components and the like are not excluded.

Also, components having the same function are denoted by the same reference symbols throughout the drawings for describing the embodiments, and the repetitive description thereof is omitted.

Hereinafter, embodiments of the present invention will be described in detail with reference to the accompanying drawings.

Figure 1:
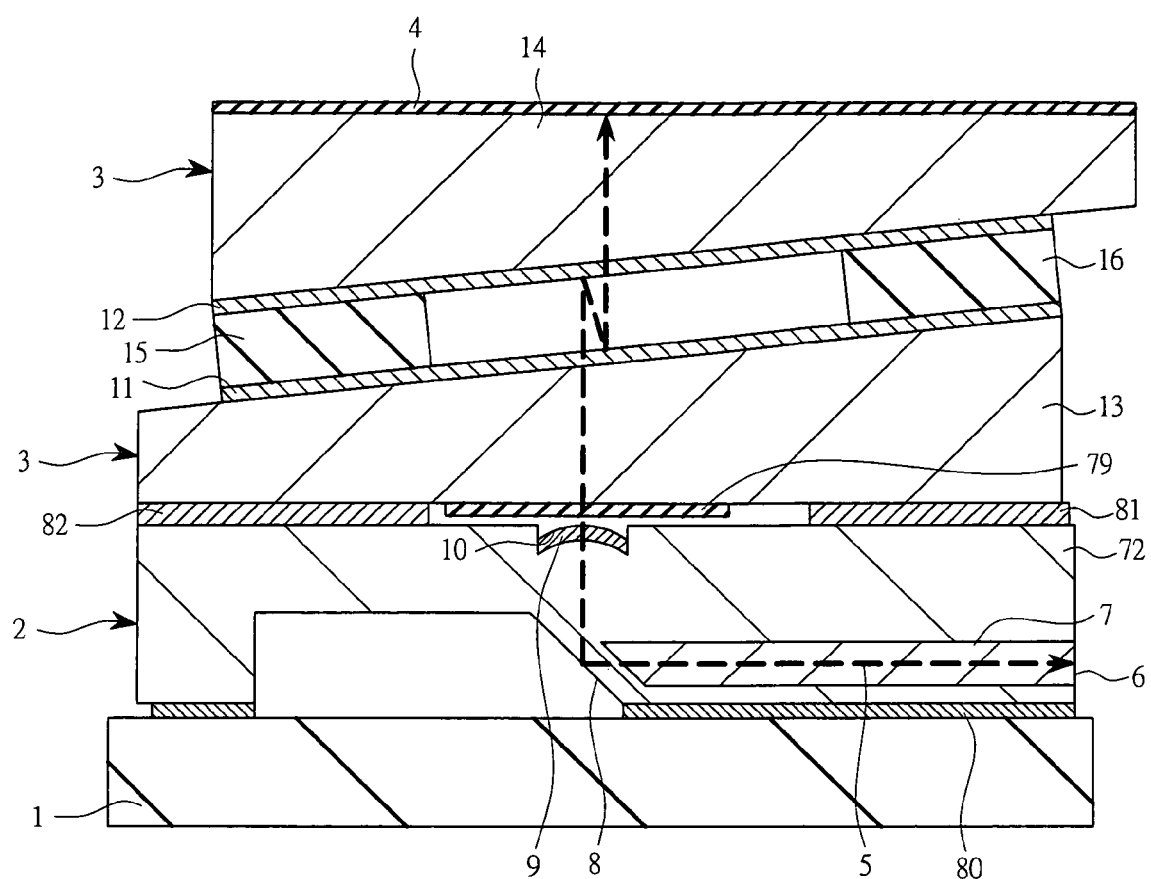
FIG. 1 is a basic configuration diagram of a wavelength variable laser according to one embodiment of the present invention.

In the embodiments of the present invention, a structure in which an optical path of the laser is vertically bent is realized in order to reduce the size of the wavelength variable laser. FIG. 1 is a basic configuration diagram for realizing the small-sized wavelength variable laser. As shown in FIG. 1, in this basic configuration, a gain chip (first semiconductor substrate) 2, an etalon filter 3 and a reflective mirror (fifth reflective mirror) 4 are arranged on an AlN submount 1. A laser cavity 5 forms a structure in which the light passes through an active layer 7 from a reflective mirror (first reflective mirror) 6 realized by an end surface of the gain chip 2, is reflected by a 45° mirror (second reflective mirror) 8 at an angle of 90°, and then passes through a lens (first convex lens) 9. The light having passed through the lens 9 is converted into parallel light, reaches the reflective mirror 4 through the etalon lens 3 and then reflected. The reflected light returns through the same optical path and reaches the reflective mirror 6 realized by the end surface of the gain chip 2. Note that a anti reflective coating 10 is applied to the surface of the lens 9. In the present embodiment, the laser cavity 5 is configured to have a vertically bent structure, so that the laser length can be shortened up to 1 mm.

Next, the principle of realizing the single mode oscillation by the laser of the present embodiment will be described with reference to FIG. 2 and FIG. 3.

Figure 2:
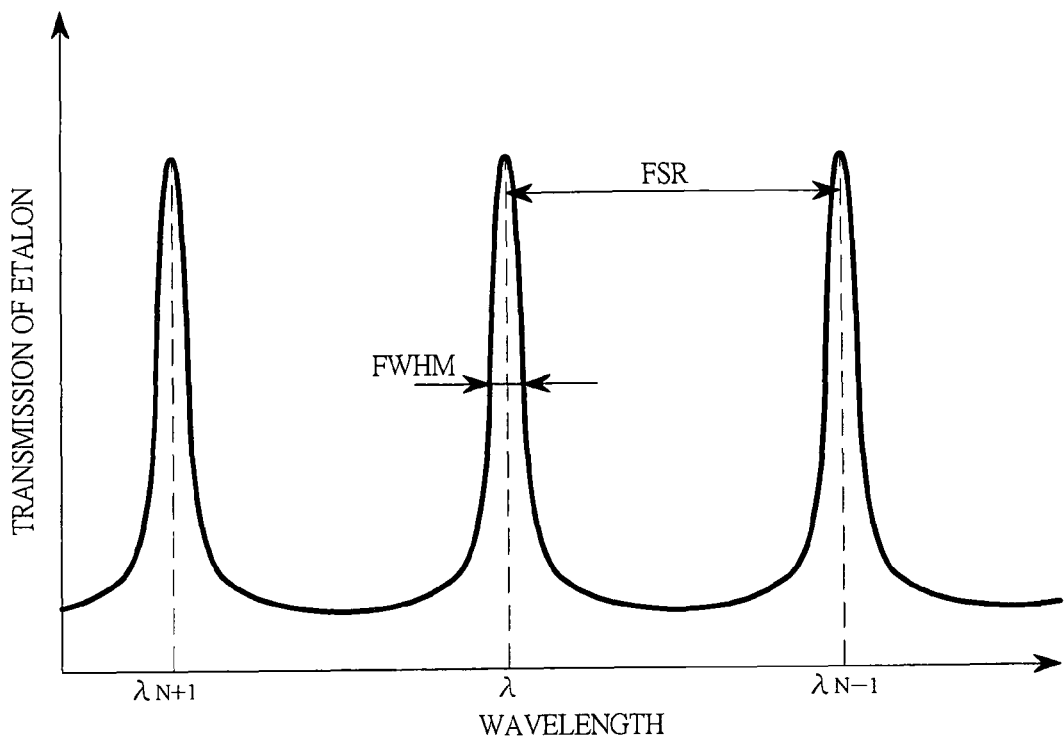
FIG. 2 is an explanatory diagram showing an operation principle of a wavelength variable laser according to one embodiment of the present invention.
Figure 3:
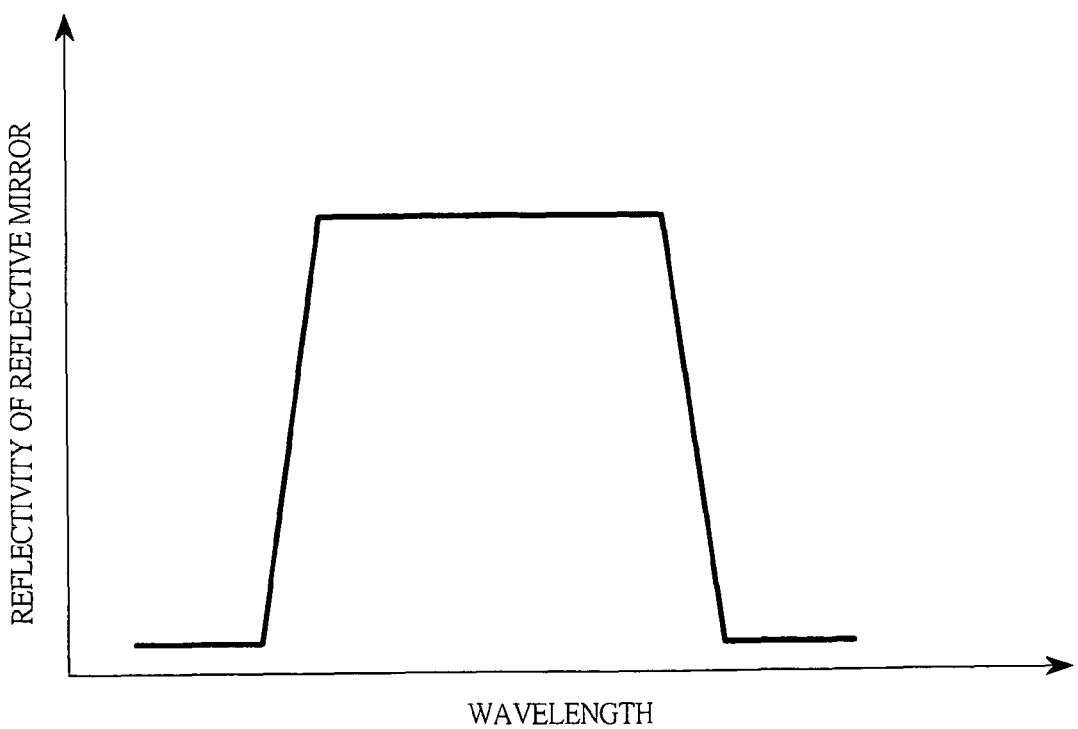
FIG. 3 is an explanatory diagram showing an operation principle of a wavelength variable laser according to one embodiment of the present invention.

FIG. 2 shows the wavelength characteristics of the transmission of the etalon filter 3. In the etalon filter 3 which is provided with a reflective mirror (third reflective mirror) 11 and a reflective mirror (fourth reflective mirror) 12 each having a thickness of T, a refractive index of $n_{eq}$ and a reflectivity of R and is formed by bonding a silicon substrate (first substrate) 13 and a silicon substrate (second substrate) 14 via spacers 15 and 16, assuming that N is an integer, light passes resonantly at $\lambda_N = n_{eq} \times T/(2 \times N)$. Also, the full width at half maximum (FWHM) thereof is FWHM=$(1-R)/\pi R^{1/2} \times \lambda_N^2/(2n_{eq}T)$. For example, when R=0.95, $n_{eq}$=1, T=15 μm and $\lambda_N$=1.55 um, FWHM=1.3 nm, and high wavelength selectivity can be provided.

Also, Free Spectral Range (FSR)=80 nm. At this time, when combined with the reflective mirror 4 having the reflectance spectrum as shown in FIG. 3, the single mode oscillation at the wavelength $\lambda_N$ can be expected. The wavelength $\lambda_N$ mentioned here can be controlled by changing the value of $n_{eq}$ or T. As the configuration for realizing the wavelength variable laser, the case of using liquid crystal etalon for achieving the principle of changing the value of $n_{eq}$ and the case of using the MEMS (Micro Electro Mechanical Systems) technology for achieving the principle of changing the value of T will be shown below.

Figure 4:
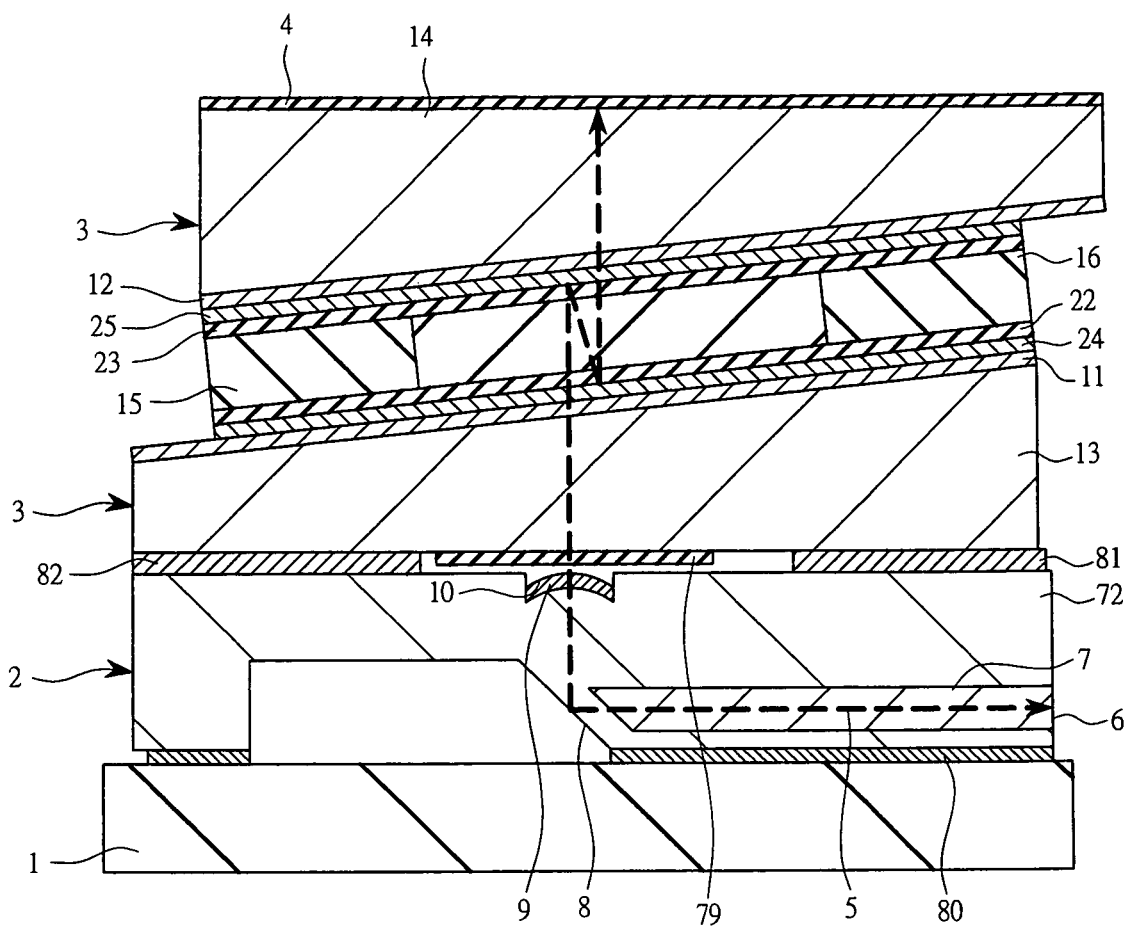
FIG. 4 is a cross sectional view of a principal part showing a configuration example of a wavelength variable laser according to one embodiment of the present invention.

FIG. 4 shows a configuration example of laser using the liquid crystal etalon filter. In this configuration, liquid crystal 21, alignment layers 22 and 23 and transparent electrodes 24 and 25 are added to the basic configuration shown in FIG. 1. In the liquid crystal etalon filter, the refractive index of the liquid crystal is changed by applying voltage, and the laser oscillation wavelength can be changed by changing the value of $\lambda_N$.

Figure 5:
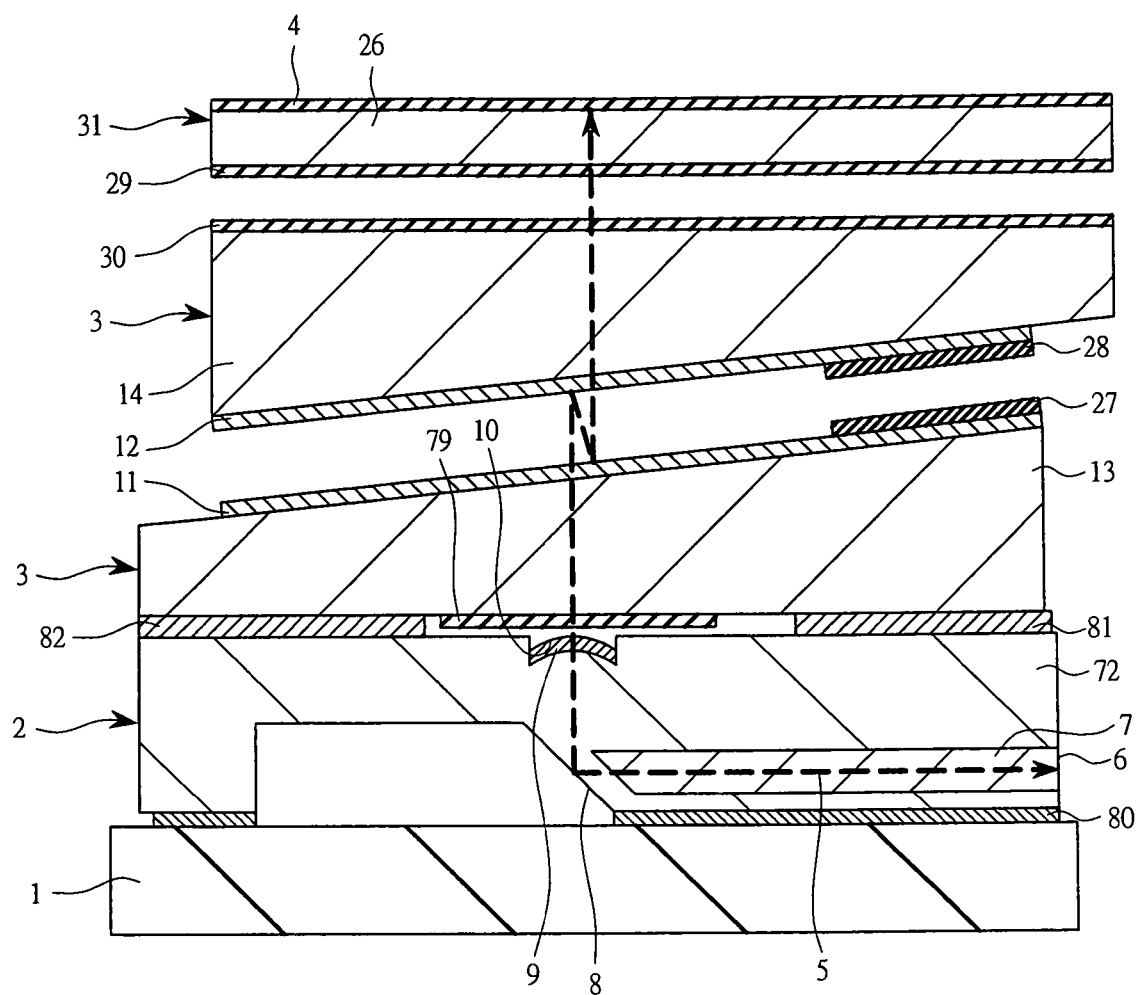
FIG. 5 is a cross sectional view of a principal part showing a configuration example of a wavelength variable laser according to one embodiment of the present invention.

FIG. 5 shows a configuration example of laser using the MEMS etalon filter. In this configuration, compared with the basic configuration shown in FIG. 1, the silicon substrate 14 is separated from the silicon substrate 26, and actuators 27 and 28 are arranged instead of the spacers 15 and 16, so that the reflective film 12 can be moved by the actuators 27 and 28. Note that a anti reflective film 29 and the reflective film 4 are formed on a lower surface and an upper surface of the silicon substrate 26, respectively, and a anti reflective film 30 is formed on an upper surface of the silicon substrate 14, whereby a reflective mirror 31 is formed. By this structure, the thickness T of the etalon filter 3 can be changed, and the oscillation wavelength becomes variable.

Here, it is possible to take the light by connecting an optical fiber to the reflective mirror 6 side on the end surface of the gain chip 2, and it is also possible to take the light by connecting an optical fiber to the reflective mirror 31 side.

Figure 6:
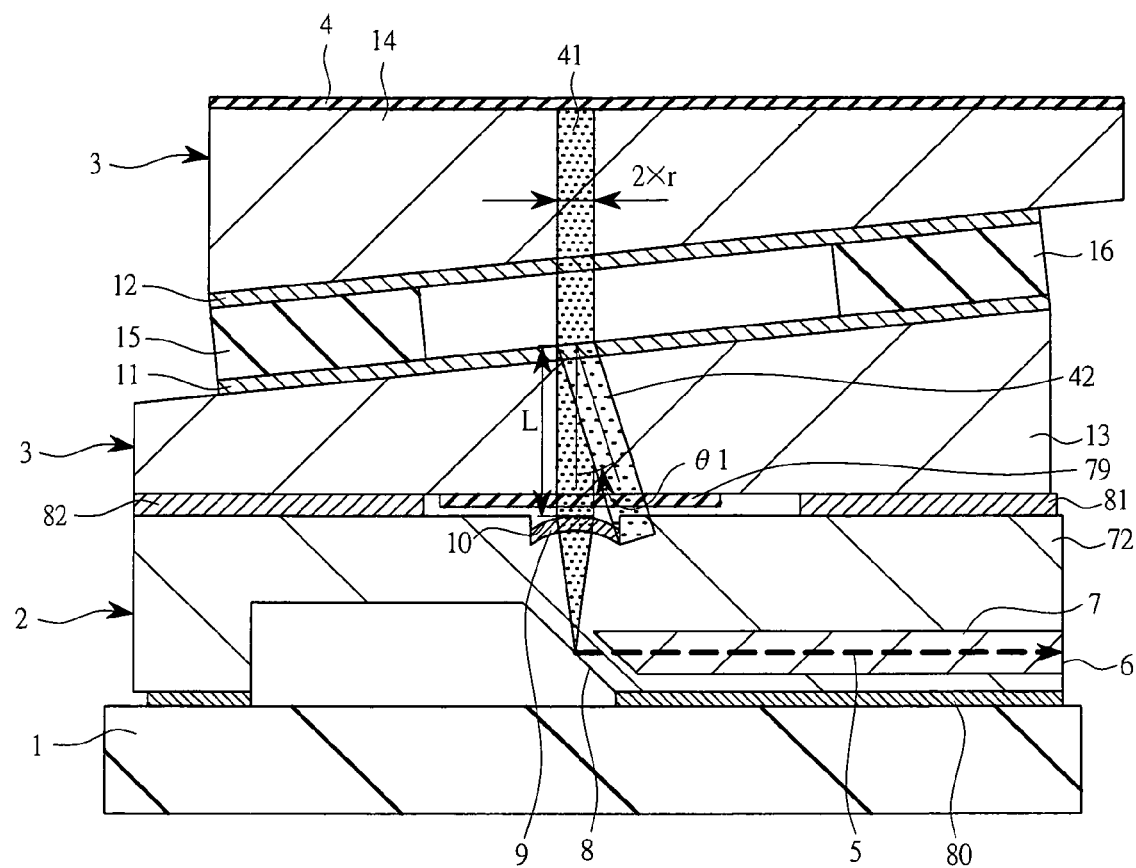
FIG. 6 is a cross sectional view of a principal part showing a configuration example of a wavelength variable laser according to one embodiment of the present invention.

Next, the method of arranging the etalon filter according to the present embodiment will be described with reference to FIG. 6. The configuration of FIG. 6 is the same as that of FIG. 1 except that incident light 41 and reflection light 73 are shown. The incident light 41 of the etalon filter is reflected by the reflective mirror 11 to be the reflection light 42. If the reflection light 42 returns to the active layer 7 with being overlapped with the former incident light 41, the wavelength selectivity as shown in FIG. 2 and FIG. 3 disappears. Therefore, the reflective mirror 11 has to be angled with respect to the direction orthogonal to the incident light 41.

Next, the angle will be considered. The distance in a direction orthogonal to an optical axis between the optical axis and a position where the intensity of the incident light 41 becomes $1/e^2$ of the intensity on the optical axis, that is, a radius of light is defined as r, the distance between the lens 9 and the reflective mirror 11 is defined as L, and the angle between the direction orthogonal to the reflective mirror 11 and the optical axis of the incident light is defined as $\theta 1$. Since what is needed is to prevent the incident light 41 and the reflection light 42 from being overlapped at the position of the lens 9, the relation "$L \times \tan(2 \times \theta 1) > 2 \times r$" must be satisfied.

Figure 7:
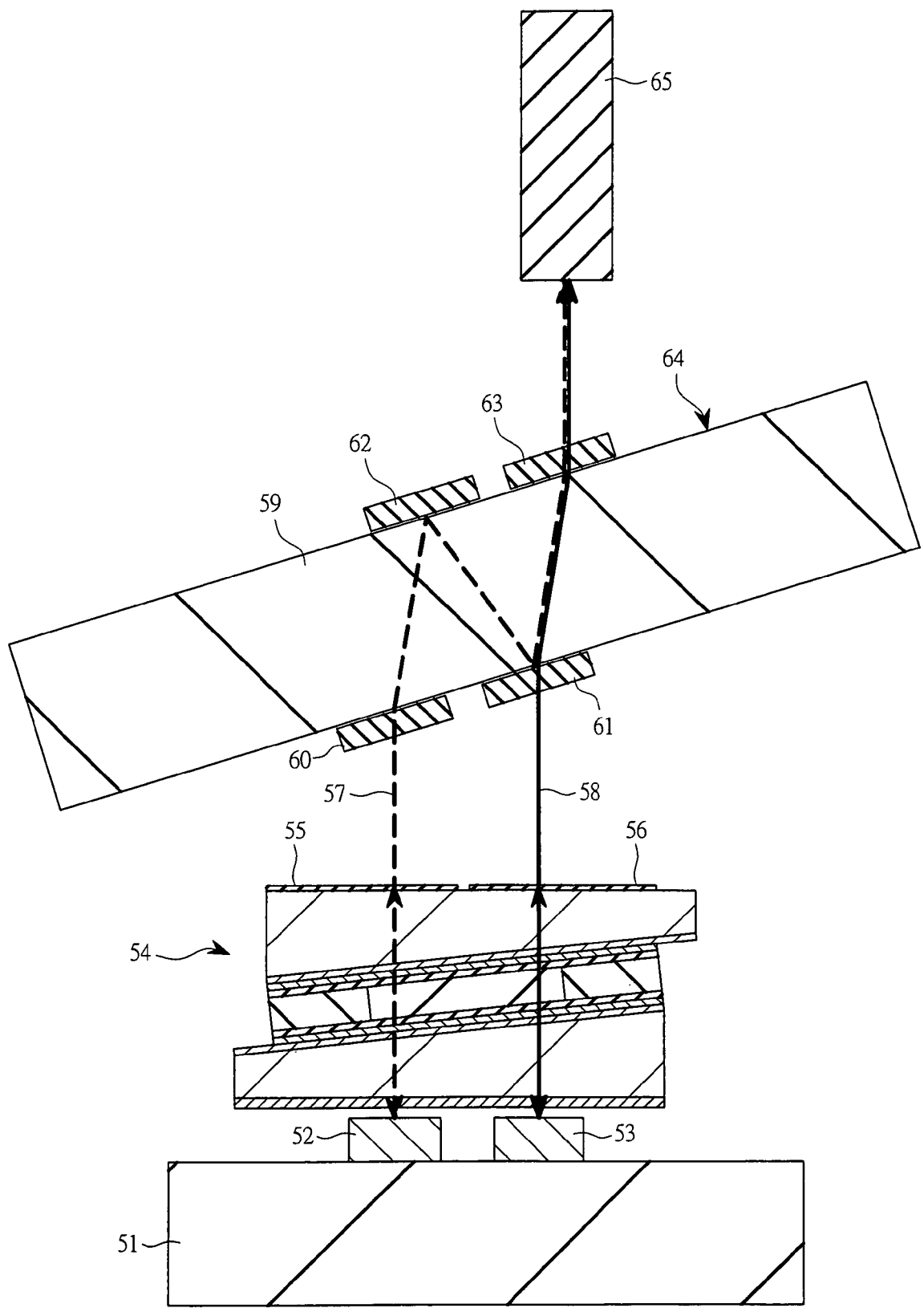
FIG. 7 is a cross sectional view of a principal part showing a configuration example of a wavelength variable laser according to one embodiment of the present invention.

Next, the means for realizing the ultrawideband wavelength variable laser will be described with reference to FIG. 7. FIG. 7 is a cross sectional view of a principal part of the configuration thereof. As shown in FIG. 7, the ultrawideband wavelength variable laser has a structure in which gain chips 52 and 53 are mounted on a submount 51. The gain chips 52 and 53 have respectively different gain wavelength bands. An etalon filter 54 having the same structure as that of the etalon filter 3 described above with reference to FIG. 4 and reflective mirrors 55 and 56 are arranged on the gain chips 52 and 53, and the laser cavities are formed between the chip end surface of the gain chip 52 and the reflective mirror 55 and between the chip end surface of the gain chip 53 and the reflective mirror 56, respectively, thereby emitting laser lights 57 and 58. Above the reflective mirrors 55 and 56, an optical multiplexer 64 obtained by forming a anti reflective film 60, a wavelength selection film (first wavelength selection filter) 61, a high-reflective film (mirror) 62 and a low-reflective film 63 on the surfaces of a glass substrate 59 is provided, and the laser lights 57 and 58 are multiplexed in this optical multiplexer (optical multiplexer/demultiplexer) 64 and outputted from an optical fiber 65. As shown in FIG. 2 and FIG. 3, the etalon filter has repetitive characteristics with respect to the wavelength, and therefore, it can be fabricated with common specifications even for the lasers emitting different wavelength bands. More specifically, by multiplexing the lights emitted from the respective lasers in the optical multiplexer 64, the lights can be outputted from the same optical fiber 65. As a result, the ultrawideband wavelength variable laser that cannot be achieved by one gain chip can be realized.

First Embodiment

The first embodiment will be described with reference to FIG. 4 and FIG. 8 to FIG. 11. The first embodiment provides the wavelength variable laser of the 1.55 μm band using a liquid crystal etalon filter. As described above with reference to FIG. 4, the wavelength variable laser according to the first embodiment has a structure in which the gain chip 2, the etalon filter 3 and the reflective mirror 4 are arranged on the AlN submount 1.

Figure 8:
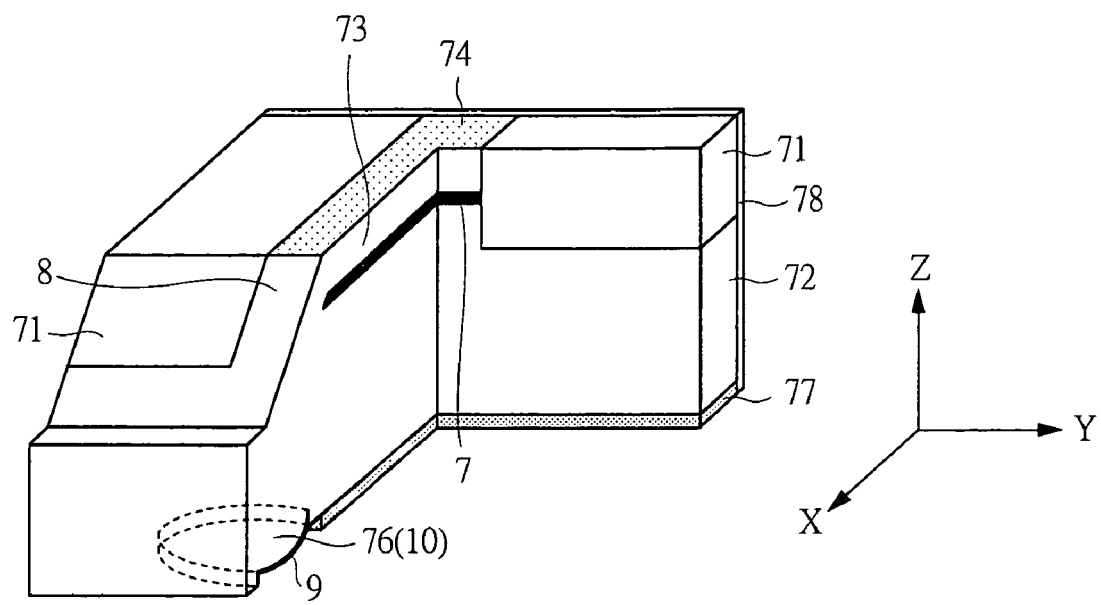
FIG. 8 is a partially cutaway view for describing the structure of a gain chip provided in a wavelength variable laser according to one embodiment of the present invention.
Figure 9:
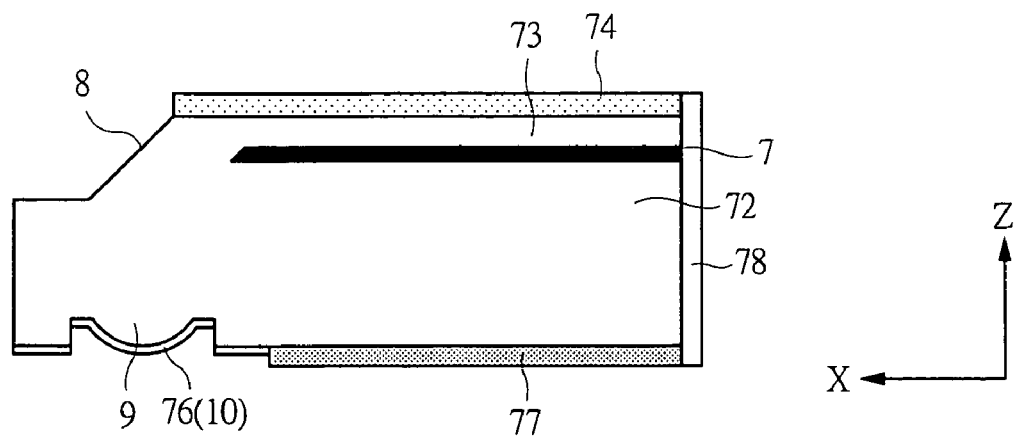
FIG. 9 is a cross sectional view of a principal part for describing the structure of a gain chip provided in a wavelength variable laser according to one embodiment of the present invention.
Figure 10:
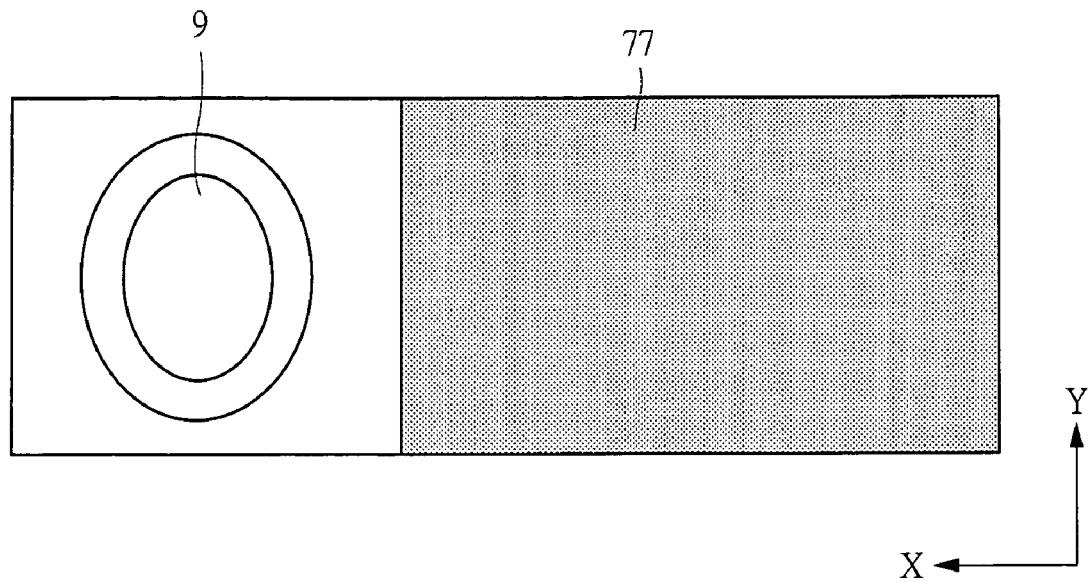
FIG. 10 is a plan view of a principal part for describing the structure of a gain chip provided in a wavelength variable laser according to one embodiment of the present invention.
Figure 11:
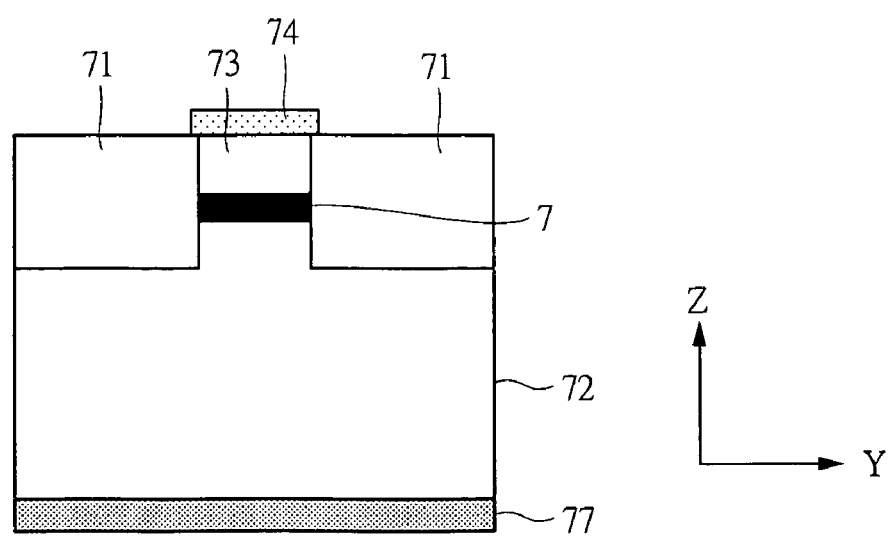
FIG. 11 is a cross sectional view of a principal part for describing the structure of a gain chip provided in a wavelength variable laser according to one embodiment of the present invention.
Figure 12:
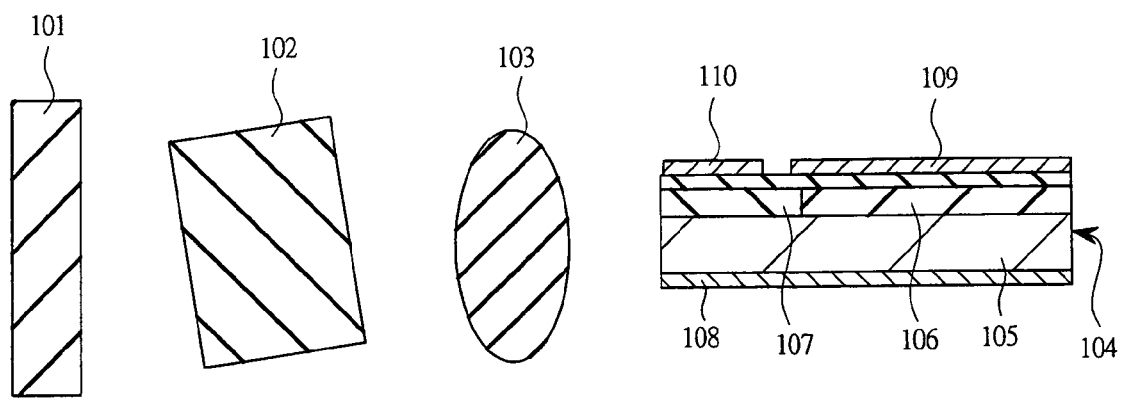
FIG. 12 is an explanatory diagram showing the configuration of a wavelength variable laser of an external cavity type using a liquid crystal filter.

FIG. 8 to FIG. 11 show the structure of the gain chip 2. FIG. 8 is a perspective cross sectional view of the gain chip 2 according to the first embodiment, FIG. 9 is a cross sectional view of the gain chip 2 taken by a plane parallel to the traveling direction of the light, FIG. 10 is a bottom view of the gain chip 2 and FIG. 11 is a cross sectional view of the gain chip 2 taken by a plane orthogonal to the traveling direction of the light, respectively. As shown in FIG. 8 and FIG. 11, an optical waveguide (optical waveguide layer) portion of the gain chip 2 is processed into a stripe shape to have the buried hetero (BH) structure. In this example, high-resistive semi-insulating InP 71 doped with iron is buried around the stripe-shaped optical waveguide portion in the buried hetero structure.

The gain chip 2 can be fabricated in the following manner. The fabrication process thereof will be described here. In order to form the structure of the laser portion, the active layer 7 including an n-type InGaAsP optical confinement layer, an InGaAlAs strained multiple quantum well layer and a p-type InGaAsP optical confinement layer, a p-type InP clad layer 73 and a p-type InGaAs contact layer are formed on a main surface (first surface) of an n-type InP substrate 72 (see FIG. 1, FIG. 5 and FIG. 6). On the InP wafer having such a multi-layer structure, a silicon dioxide film is coated as a protective mask. The p-type InP clad layer 73, the active layer 7 and a part of the n-type InP substrate 72 are etched with using this silicon dioxide mask, thereby forming the optical waveguide. For the etching, for example, any of the methods including dry etching such as the reactive ion etching (RIE) using the chlorine-based gas, wet etching using bromine-based solution and the combination use thereof can be employed.

Next, the sample to which the above-described process has been performed is carried into a crystal growth chamber, and the semi-insulating InP layer 71 doped with Fe is buried and grown at about 600° C. by using the MOVPE method. By the etching process and the processes for regrowing the buried layer, the buried hetero structure is formed. In this buried hetero structure, both sides in the traveling direction of the light of the optical waveguide are buried with the material capable of confining the light. The material used for this confinement is, for example, a high-resistive material, and the high-resistive semi-insulating InP 71 doped with Fe is used in the first embodiment. FIG. 11 is a cross sectional view of the gain chip 2 taken by the plane orthogonal to the traveling direction of the light of the element.

Note that, in the process of forming the buried structure, the end of the optical waveguide on the light emitting side is also buried with semi-insulating InP 71 at the same time with burying the both sides of the optical waveguide in the light traveling direction. The end of the optical waveguide is buried with InP 71, so that the part of the 45° inclined (45° mirror 8) to be processed by etching is made of the InP material only. By this means, the process of completely smoothing the mirror formed by etching can be facilitated.

Thereafter, after the silicon dioxide film used as a selective growth mask for the buried growth is removed, a silicon nitride film for an etching mask is formed, and the semi-insulating InP layer 71 doped with Fe is etched so as to have the inclination angle of 45°. In this inclination etching, chemically assisted ion beam etching (CAIBE) using chlorine and argon gas is used, and the etching surface of 45° can be realized by performing the etching while inclining the wafer surface by 45°. Note that, in the first embodiment, the etching method using CAIBE has been described, but the reactive ion beam etching (RIBE) using chlorine-based gas and the wet etching are also available.

Next, after removing the silicon nitride film, a p-side electrode 74 is deposited on the p-type InGaAs contact layer. Further, after a rear surface (second surface) of the n-type InP substrate 72 is polished to have the thickness of about 100 μm, a silicon nitride mask is formed on the rear surface of the n-type InP substrate 72. Subsequently, an outer circumference of a part to be the lens is etched into a ring shape to the depth of about 16 μm by the reactive ion etching using mixed gas of methane and hydrogen. At this time, the ring-shaped pattern has a circular shape as shown in FIG. 10. Subsequently, the silicon nitride mask formed on the columnar portion surrounded by the portion carved into the ring shape is removed, and the wet etching is performed using the mixed solution of hydrobromic acid, hydrogen peroxide and water. By this means, the columnar portion is etched from its surface and the corner thereof is removed, so that the convex lens 9 can be formed on the rear surface of the n-type InP substrate 72.

Next, the silicon nitride mask is completely removed, and a low-reflective coating film 76 (anti reflective coating 10) made of silicon oxynitride is formed on the surface of the lens 9. Then, an n-side electrode 77 is formed on the rear surface of the n-type InP substrate 72. Also, a low-reflective film 78 used in a semiconductor optical element is formed on a part to be a back end surface of the element, thereby completing the gain chip 2.

The liquid crystal etalon can be fabricated in the following manner. First, the silicon substrates 13 and 14 are wet-etched to form a surface inclined by only 3°. Next, an $SiO_2$ film is formed by sputtering on the silicon substrates 13 and 14, and a $TaO_2$ film is further formed by sputtering on the $SiO_2$ film, thereby forming the anti reflective films 4 and 79 (see FIG. 1, FIG. 5 and FIG. 6). Next, the reflective mirrors 11 and 12 are formed on the other surfaces of the silicon substrates 13 and 14. Then, the transparent electrodes 24 and 25 made of ITO (indium tin oxide) are formed by sputtering. Subsequently, the alignment layers 22 and 23 are formed by the coating method. Next, the spacers 15 and 16 for shielding the liquid crystal are formed on the alignment layers 22 and 23. Next, the silicon substrates 13 and 14 are bonded so that the alignment layers 22 and 23 are faced to each other, and the liquid crystal is injected, thereby completing the liquid crystal etalon filter.

For example, the fabrication method of the wavelength variable laser is as follows. First, the gain chip 2 is fixed on a gain current electrode 80 of the submount 1. Next, after the lens 9 and the anti reflective film 79 are approximately faced to each other, the position of the liquid crystal etalon filter is finely adjusted so as to cause the laser oscillation, and the liquid crystal etalon filter is mounted on ground electrodes 81 and 82 of the gain chip 2.

In the wavelength variable laser according to the first embodiment, the single mode oscillation can be caused in a wide wavelength range from 1.53 μm to 1.57 μm by the control of the voltage applied to the liquid crystal etalon filter and the current injection to the gain multilayer.

Also, a silicon substrate is used as a substrate of the liquid crystal etalon filter in the first embodiment, but a glass substrate may be used instead of the silicon substrate.

Further, an InP substrate is used as a substrate of the gain chip 2 in the first embodiment, but a substrate made of GaAs, GaN, ZnSe or others may be used instead of the InP substrate.

Further, the oscillation wavelength of the wavelength variable laser is limited to the 1.55 μm band in the first embodiment, but 1.3 μm band is also available. Also, when a glass substrate is used as a substrate of the liquid crystal etalon filter, the oscillation in the visible light range of the wavelength from 0.4 μm to 0.9 μm is possible.

Second Embodiment

The second embodiment will be described with reference to FIG. 5 and FIG. 8 to FIG. 11. The second embodiment provides the wavelength variable laser of the 1.55 μm band using a MEMS etalon. The gain chip 2, the MEMS etalon filter and the reflective mirror 4 are arranged on the AlN submount 1.

The fabrication method of the gain chip 2 of the second embodiment is the same as that of the first embodiment.

In the MEMS etalon filter according to the second embodiment, the reflective mirrors 11 and 12 are formed on a silicon substrate by the known method. In this case, the reflective mirror 12 is configured to be moved by applied voltage.

In the wavelength variable laser according to the second embodiment, the single mode oscillation can be caused in a wide wavelength range from 1.53 μm to 1.57 μm by the control of the voltage applied to the MEMS etalon filter and the current injection to the gain multilayer.

Further, the oscillation wavelength of the wavelength variable laser is limited to the 1.55 μm band in the second embodiment, but 1.3 μm band is also available.

Third Embodiment

The third embodiment will be described with reference to FIG. 7 and FIG. 8 to FIG. 11. The third embodiment provides the wavelength variable laser with the wavelength range from 1.53 μm to 1.62 μm using a liquid crystal etalon filter.

The gain chips 52 and 53, the etalon filter 54 and the reflective mirrors 55 and 56 are arranged on the AlN submount 51. Further, the optical multiplexer 64 formed of the glass substrate 59 and the optical fiber 65 are arranged.

The fabrication method of the gain chips 52 and 53 of the third embodiment is the same as that of the first embodiment. However, the composition of the InGaAsP active layer is changed so that the gain chip 52 has a gain in the wavelength of 1.53 μm to 1.57 μm and the gain chip 53 has a gain in the wavelength of 1.57 μm to 1.62 μm. The fabrication method of the liquid crystal etalon filter (etalon filter 54) is the same as that of the first embodiment. However, the reflective mirror 55 has a reflectivity of 90% or more in the wavelength range from 1.53 μm to 1.57 μm, and the reflective mirror 56 has a reflectivity of 90% or more in the wavelength range from 1.57 μm to 1.62 μm.

In the optical multiplexer 64, the transparent glass substrate 59 is used as a support substrate, and the anti reflective film 60 having a reflectivity of 0.1% or less and the wavelength selection film 61 are adjacently deposited on one surface of the glass substrate 59. Also, on the other surface of the glass substrate parallel to the surface on which the anti reflective film 60 and the wavelength selection film 61 are formed, the high-reflective film 62 and the anti reflective film 63 having a reflectivity of 0.1% or less are adjacently deposited. The wavelength selection film 61 reflects the laser light 57 emitted from the gain chip 52 and transmits the laser light 58 emitted from the gain chip 53, thereby multiplexing the two lights.

In the wavelength variable laser according to the third embodiment, the single mode oscillation can be caused in a wide wavelength range from 1.53 μm to 1.57 μm by the control of the voltage applied to the etalon filter 54 and the current injection to the gain multilayer on the gain chip 52. Also, the single mode oscillation can be caused in a wide wavelength range from 1.57 μm to 1.62 μm by the current injection to the gain multilayer on the gain chip 53. As a result, the light in the range from 1.53 μm to 1.62 μm can be outputted from the optical fiber 65.

The oscillation wavelength of the wavelength variable laser is limited to the 1.55 μm band in the third embodiment, but 1.3 μm band is also available. Also, the oscillation in the visible light range of the wavelength from 0.4 μm to 0.9 μm is possible.

A glass substrate may be used as a substrate of the liquid crystal etalon filter (etalon filter 54). Also, the etalon filter 54 may be replaced with a MEMS etalon filter.

Also, an InP substrate is used as a substrate of the gain chips 52 and 53 in the third embodiment, but a substrate made of GaAs, GaN, ZnSe or others may be used instead of the InP substrate.

Further, an example where two gain chips are arranged has been described in the third embodiment, but three or more gain chips may be arranged.

In the foregoing, the invention made by the inventors of the present invention has been concretely described based on the embodiments. However, it is needless to say that the present invention is not limited to the foregoing embodiments and various modifications and alterations can be made within the scope of the present invention.

The semiconductor laser apparatus according to the present invention can be applied to, for example, a wavelength variable laser.

What is claimed is:

1. A semiconductor laser apparatus comprising:
   a first semiconductor substrate;
   an optical waveguide layer including an active layer formed on a part of a first surface of the first semiconductor substrate;
   a first reflective mirror provided at one end of the optical waveguide layer;
   a second reflective mirror which is a 45° mirror provided at the other end of the optical waveguide layer on an opposite side of the one end and inclined by 45° with respect to an extending direction of the optical waveguide layer;
   a first convex lens provided on a second surface of the first semiconductor substrate on a back side of the first surface so as to be on an optical axis of the second reflective mirror;
   an etalon provided above the second surface and including a first substrate and a second substrate having spacers disposed therebetween, the first substrate being of trapezoidal shape and having a first angled surface with a third reflective mirror disposed thereon, the second substrate being of trapezoidal shape, located above the first substrate, and having a second angled surface with a fourth reflective mirror disposed thereon, the first and second angled surfaces having opposing inclinations with respect to the first surface of the first semiconductor substrate, the spacers being disposed between the first angled surface of the first substrate and the second angled surface of the second substrate; and
   a fifth reflective mirror provided above the fourth reflective mirror of the etalon,
   wherein the fifth reflective mirror is provided orthogonally to an optical axis of light emitted from the first convex lens, and a laser cavity is constituted between the first reflective mirror and the fifth reflective mirror.

2. The semiconductor laser apparatus according to claim 1, wherein, when an angle between an optical axis of the light emitted from the first convex lens and incident on the third reflective mirror and a direction orthogonal to the third reflective mirror is defined as θ1, a radius of the light which is a distance in a direction orthogonal to the optical axis of the light between the optical axis and a position where an intensity of the light emitted from the first convex lens becomes $1/e^2$ of an intensity on the optical axis of the light is defined as r, and a distance between the first convex lens and the first reflective mirror is defined as L, a relation of $L \times \tan(2 \times \theta1) > 2 \times r$ is satisfied.

3. The semiconductor laser apparatus according to claim 1,
   wherein liquid crystal is confined between the third and fourth reflective mirrors, and
   an electrode for applying voltage to the liquid crystal is provided on the third and fourth reflective mirrors.

4. The semiconductor laser apparatus according to claim 1, wherein the third reflective mirror or the fourth reflective mirror has means capable of moving the third reflective mirror or the fourth reflective mirror in a direction of the optical axis of the light emitted from the first convex lens.

5. The semiconductor laser apparatus according to claim 1, wherein an optical fiber is provided adjacently to the first reflective mirror.

6. The semiconductor laser apparatus according to claim 1, wherein an optical fiber is provided adjacently to the fifth reflective mirror.

7. A semiconductor laser apparatus comprising:
   a second semiconductor substrate;
   a first optical waveguide layer including a first active layer formed on a part of a third surface of the second semiconductor substrate;
   a sixth reflective mirror provided at one end of the optical waveguide layer;
   a seventh reflective mirror which is a 45° mirror provided at the other end of the optical waveguide layer on an opposite side of the one end and inclined by 45° with respect to an extending direction of the optical waveguide layer;

a second convex lens provided on a fourth surface of the second semiconductor substrate on a back side of the third surface so as to be on an optical axis of the seventh reflective mirror;

an first etalon provided above the fourth surface and including a third substrate and a fourth substrate having spacers disposed therebetween, the third substrate being of trapezoidal shape and having a first angled surface with an eighth reflective mirror disposed thereon, the fourth substrate being of trapezoidal shape, located above the third substrate, and having a second angled surface with a ninth reflective mirror disposed thereon, the first and second angled surfaces having opposing inclinations with respect to the first surface of the second semiconductor substrate, the spacers being disposed between the first angled surface of the third substrate and the second angled surface of the fourth substrate;

a tenth reflective mirror provided above the ninth reflective mirror of the first etalon so as to be orthogonal to an optical axis of light emitted from the second convex lens;

a third semiconductor substrate;

a second optical waveguide layer including a second active layer formed on a part of a fifth surface of the third semiconductor substrate;

an eleventh reflective mirror provided at one end of the second optical waveguide layer;

a twelfth reflective mirror which is a 45° mirror provided at the other end of the second optical waveguide layer on an opposite side of the one end and inclined by 45° with respect to an extending direction of the second optical waveguide layer;

a third convex lens provided on a sixth surface of the third semiconductor substrate on a back side of the fifth surface so as to be on an optical axis of the twelfth reflective mirror;

a second etalon provided above the sixth surface and including a fifth substrate having a thirteenth reflective mirror and a sixth substrate having a fourteenth reflective mirror on the fifth substrate; and a fifteenth reflective mirror provided above the fourteenth reflective mirror of the second etalon so as to be orthogonal to an optical axis of light emitted from the third convex lens, wherein a first laser cavity is constituted between the sixth reflective mirror and the tenth reflective mirror, and a second laser cavity is constituted between the eleventh reflective mirror and the fifteenth reflective mirror.

8. The semiconductor laser apparatus according to claim 7, further comprising:

an optical multiplexer/demultiplexer constituted of a plurality of mirrors arranged in parallel above the tenth and fifteenth reflective mirrors, wherein the optical multiplexer/demultiplexer includes at least a first wavelength selection filter and a mirror provided apart from the first wavelength selection filter by a predetermined distance so as to be faced in parallel to the first wavelength selection filter, the optical multiplexer/demultiplexer is fixed in a package for housing the second semiconductor substrate, the third semiconductor substrate and the optical multiplexer/demultiplexer in a state of being inclined by an angle $\theta(\theta \neq 2N\pi$ and N is an optional integer) with respect to the fourth surface of the second semiconductor substrate and the fifth surface of the third semiconductor substrate, a first emitted light from the tenth reflective mirror is incident on the optical multiplexer/demultiplexer, reflected by the mirror and then reflected by the first wavelength selection filter, and a second emitted light from the fifteenth reflective mirror is incident on the optical multiplexer/demultiplexer and multiplexed with the first emitted light by the first wavelength selection filter.

* * * * *